United States Patent [19]
Onodera et al.

[11] 3,980,904
[45] Sept. 14, 1976

[54] ELASTIC SURFACE WAVE DEVICE

[75] Inventors: Toshihiro Onodera, Kawasaki; Shigehumi Morishita, Yokohama, both of Japan

[73] Assignee: Tokyo Shibaura Electric Co., Ltd., Tokyo, Japan

[22] Filed: Oct. 24, 1974

[21] Appl. No.: 517,774

[30] Foreign Application Priority Data

| | | |
|---|---|---|
| Oct. 26, 1974 | Japan | 48-119997 |
| July 8, 1974 | Japan | 49-78020 |
| July 8, 1974 | Japan | 49-78021 |
| July 12, 1974 | Japan | 49-79935 |

[52] U.S. Cl. ................................ 310/8.1; 310/9.6; 310/9.8; 333/30 R
[51] Int. Cl.² .......................................... H01L 41/08
[58] Field of Search ............... 310/9.5, 9.6, 9.7, 9.8, 310/8.1; 333/30 R, 72

[56] References Cited
UNITED STATES PATENTS

| | | |
|---|---|---|
| 3,353,120 | 11/1967 | Tournois ........................ 333/30 R |
| 3,435,381 | 3/1969 | Tournois ........................ 333/30 R |
| 3,564,461 | 2/1971 | Jernigan ........................ 333/30 R |
| 3,654,574 | 4/1972 | Dias ........................ 333/30 R |
| 3,753,164 | 8/1973 | DeVries ........................ 310/9.8 X |
| 3,781,721 | 12/1973 | Judd et al. ........................ 333/30 R |
| 3,795,879 | 3/1974 | Whitehouse ........................ 310/9.8 X |
| 3,818,379 | 6/1974 | Wauk ........................ 310/9.8 X |
| 3,887,887 | 6/1975 | Wagers et al. ........................ 310/9.5 X |

Primary Examiner—Mark O. Budd
Attorney, Agent, or Firm—Cushman, Darby & Cushman

[57] ABSTRACT

An elastic surface wave device comprises a piezoelectric body and interdigital type electric signal-surface wave conversion conductors formed one at each end portion of one surface of the piezoelectric body. A groove elongated in a surface wave propagation direction is provided in a surface opposite to the surface on which the conversion conductors are formed.

10 Claims, 16 Drawing Figures

ELASTIC SURFACE WAVE DEVICE

This invention relates to an elastic surface wave device and, in particular, an elastic surface wave device capable of suppressing spurious signals by providing a groove which is elongated in an elastic surface wave propagation direction.

Already known is an elastic surface wave device in which input and output electrodes for effecting conversion between electrical signals and elastic surface waves are provided on a piezoelectric body and electrical signal is converted by the input electrode into an elastic surface wave and the elastic surface wave is converted by the output electrode into electric signal.

With the elastic surface wave device it is necessary that a signal applied to an input electrode be faithfully reproduced at an output electrode. In actual practice, however, spurious signals appear of the reproduced output signal. In an attempt to eliminate bulk waves which lead to such a spurious response, an elongated groove is provided in a direction perpendicular to that in which a surface wave is propagated, as shown, for example, in FIG. 2 of IEEE Trans. BTR, Jan. 14, 1971 "Characteristics of surface wave integratable filters". In the prior art, however, a spurious response appearing in the neighborhood of double the frequency of a main response is not sufficiently suppressed as shown in FIG. 1.

It is accordingly the object of this invention to provide an elastic surface wave device capable of suppressing the spurious response of frequency characteristics.

According to this invention there is provided an elastic surface wave device in which first and second conductors consisting of a pair of multi-fingered electrodes insulated from each other, arranged close to each other in an interdigital fashion and adapted to effect conversion between a surface wave and electric signal are formed on one surface of a piezoelectric body and at least one groove elongated in a surface wave propagation direction is formed in a surface opposite to the surface on which the conductors are provided. Particularly, when an angle at which the elongated groove is made to the elastic surface wave propagation direction is less than 45°, the depth of the elongated groove is more than 0.01 λsh and the width of the elongated groove is equal to a length corresponding to more than 5% of the overlapped length of the finger of the interdigital conductor, prominent effects are obtained.

This invention will be further described with reference to the accompanying drawings, in which.

The embodiments of this invention will be explained by reference to the accompanying drawings.

Figure 1:
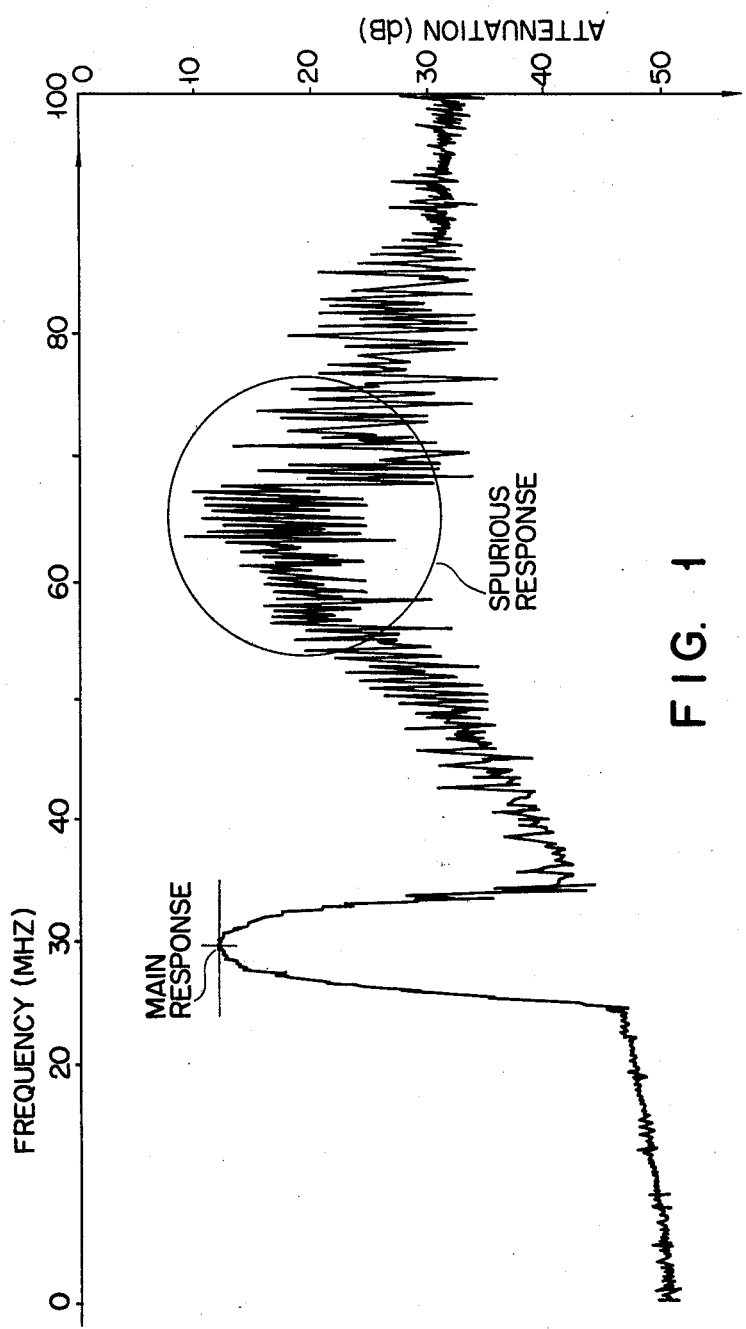
FIG. 1 is a graphical representation showing the frequency characteristics of a prior art elastic surface wave device.
Figure 2:
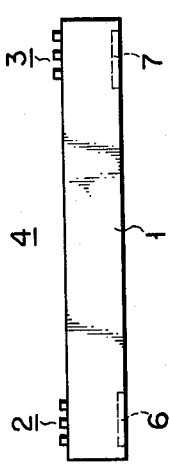
FIG. 2 is a side view showing an elastic surface wave device according to one embodiment of this invention.
Figure 3:
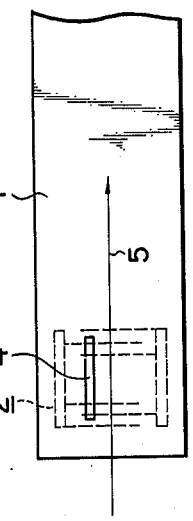
FIG. 3 is a plan view of the device of FIG. 2.
Figure 4:
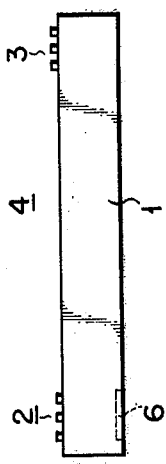
FIG. 4 is a side view showing a modified elastic surface wave device according to this invention.
Figure 5:
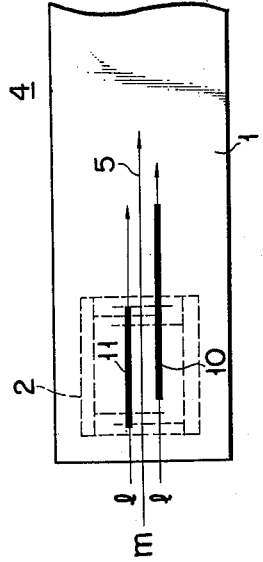
FIGS. 5 and 6 are views for explaining the other embodiments of this invention.
Figure 6:
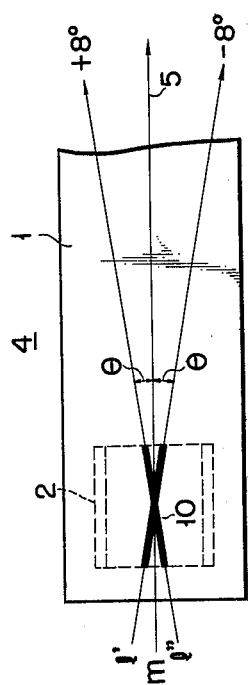

First of all, there will be explained the case where a surface wave transmission medium is made of a piezoelectric material. In FIGS. 1 and 2 an electric signal-surface wave transducer (input side) 2 is provided on one side of one surface of a piezoelectric body, such as lithium niobium trioxide ($LiNbO_3$) piezoelectric substrate 1, and an electric signal-surface wave transducer (output side) 3 is provided on the other side of one surface of the piezoelectric substrate 1. The electric signal-surface wave transducers 2 and 3 are, for example, so-called interdigital transducers. The substrate 1 has, for example, a width of 10 mm, a length of 40 mm and a thickness of 1 mm. The interdigital transducer having 25 pairs of fingers is formed by a Cr-Au vapor deposition on the substrate 1 to constitute a surface wave element 4. With the surface wave element 4 an elastic surface wave is transmitted from the input side interdigital transducer 2 to the output side interdigital transducer 3. According to this invention, a groove 6 is provided in a surface opposite to the surface of the substrate on which the interdigital transducer 2 is provided, while a groove 7 is formed in the surface opposite to the surface of the substrate on which the interdigital transducer 3 is provided. The grooves 6 and 7 extend in a direction indicated by an arrow 5 in which the elastic surface wave is propagated. As shown in FIG. 4 the surface wave element 4 may have only one groove 6 provided on the surface opposite to the surface of the substrate on which one interdigital transducer is provided. It is only sufficient that the groove 6 extends in the direction of the arrow 5 in which the elastic surface wave is propagated. As shown in FIG. 5 a plurality of grooves 10, 11 may be provided in the substrate. The groove may extend beyond the scope within which the interdigital transducer is provided. The groove may be angularly displaced relative to the elastic surface wave propagating direction 5 as shown in FIG. 6.

By varying an angle $\theta$ at which the groove is made to the elastic wave direction 5, various samples were prepared and the suppression effect of spurious signals were examined. In the configuration of FIG. 2 the piezoelectric substrate was made of lithium niobium trioxide ($LiNbO_3$) and interdigital type electric signal-surface wave transducers 2 and 3 having 25 pairs of fingers were formed by a Cr-Au vapor deposition on one surface of the substrate to constitute a surface wave element.

Figure 7:
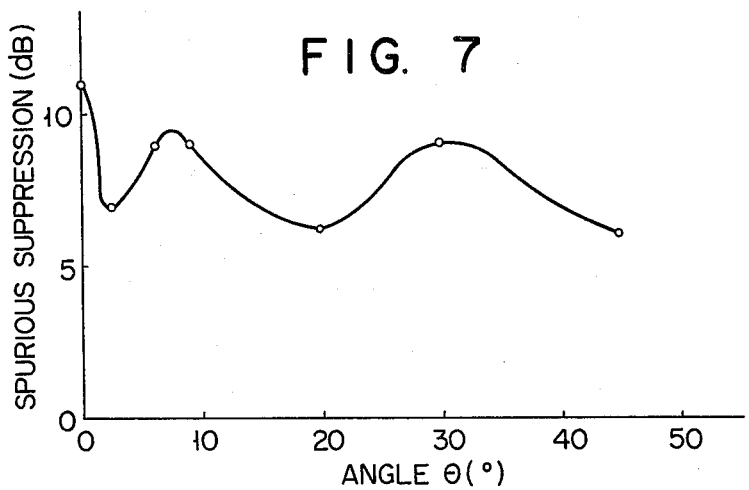
FIG. 7 is a graphical representation showing a relation between a spurious signal suppression and the angle at which a groove of FIG. 6 is made to an elastic surface wave propagation direction.

The transducer was constituted of a pair of multifingered electrodes insulated from each other and arranged close to each other in an interdigital fashion. The overlapped length of the finger of the interdigital transducer was made uniform. A groove having a depth of 88μ and a width of 0.5 mm was provided in a surface opposite to the surface on which the interdigital transducer is formed. The groove was formed in a direction in which an elastic surface wave is propagated. The characteristic of the samples is shown in FIG. 7. In the graphical representation of FIG. 7 the degree of suppression is shown using as a reference (0 dB) the level of a spurious surface wave response when no groove is provided in the surface wave element. As will be evident from FIG. 7, when the groove extends parallel to the surface wave propagation direction 5, i.e., at a zero angle to the surface wave propagation direction 5, maximum suppression is obtained. The characteristic of the suppression degree is such that, as the angle at which the groove is made to the surface wave propagation direction is increased, a vibration characteristic appears. This vibration characteristic is sequentially attenuated as the above-mentioned angle is increased.

Where the groove was formed at an angle of 90° (not shown) to the surface wave propagation direction 5, the suppression of spurious signals was about 2.5 dB.

According to this invention it is possible to suppress the spurious signal within a practical range if the groove is set at an angle of less than 45° to the surface wave propagation direction 5.

Let us now explain the relation between the width of the groove and the suppression of spurious signals.

Figure 8:
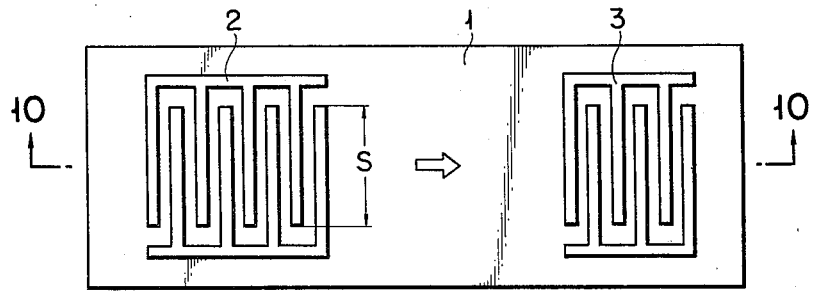
FIG. 8 is a plan view of the elastic surface wave device.
Figure 9:
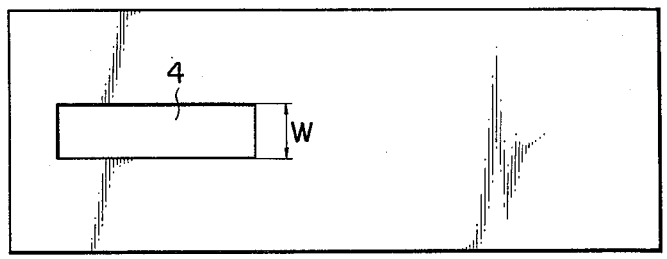
FIG. 9 is a bottom view of the elastic surface wave device.
Figure 10:
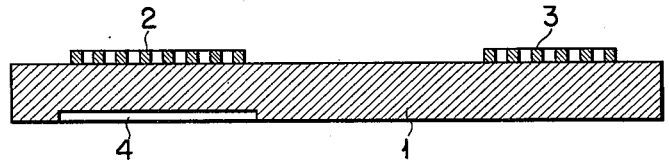
FIG. 10 is a side view of the elastic surface wave device.
Figure 11:
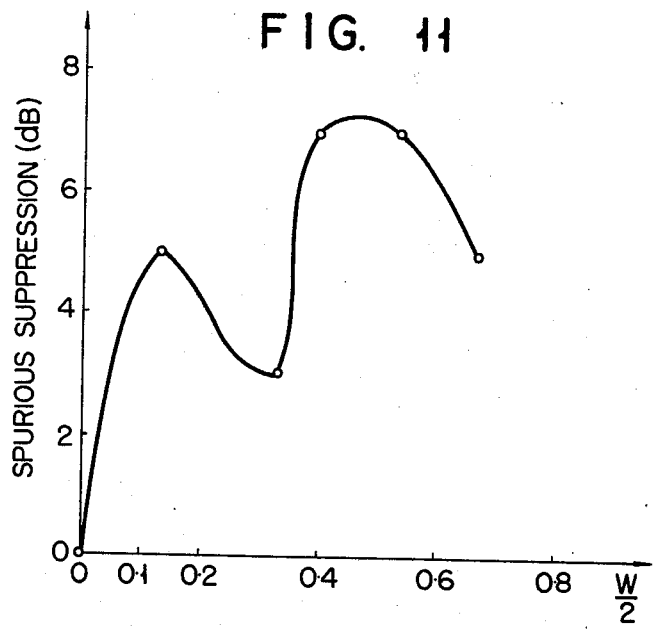
FIG. 11 is a graphical representation showing a relation between a spurious signal suppression and the width of the groove of FIG. 3.

By varying the width of the groove various samples were prepared and the suppression of spurious signals was examined. In the configuration of FIG. 8 use was made, as a piezoelectric substrate, of a Y-cut Z-axis-propagating lithium niobium trioxide (LiNbO$_3$) substrate having a length of 40 mm, a width of 10 mm and a thickness of 1 mm. Interdigital type electric signal-surface wave transducers 2 and 3 having 25 pairs of fingers were formed by a Cr-Au vapor deposition on one surface of the substrate to constitute a surface wave element. A groove having a depth D of 44 $\mu$m was formed as shown in FIG. 10. Said samples were formed by ultrasonically broadening the width W of the groove as shown in FIG. 9. The suppression characteristics of the samples is shown in FIG. 11. In the graphic representation of FIG. 11 a ratio of the width W of the groove to the overlapped length S of the electrode finger of the interdigital transducer is plotted as an abscissa, while the suppression of spurious signals is plotted as an ordinate.

The overlapped length S of the electrode finger of the interdigital transducer is an area, as shown in FIG. 8, where conversion between the surface wave and electric signal is effected.

As will be understood from FIG. 11, if the width W of the groove is 5% greater than the overlapped length S of the electrode finger of the interdigital transducer, it is possible to suppress the spurious noise within a practical range. When the width W of the groove is so selected as to correspond to half the length S of the the electrode finger of the interdigital transducer, the suppression of more than 7 dB can be obtained.

The depth of the groove will be explained below.

Figure 12:
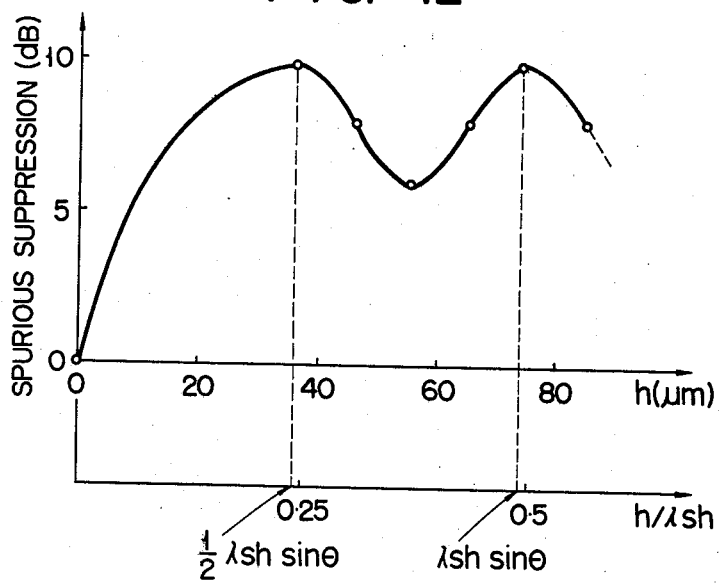
FIG. 12 is a graphical representation showing a relation between a spurious signal suppression and the depth of the groove.

In the configuration of FIG. 2 interdigital type electric signal-surface wave transducers were formed on one surface of a lithium niobium trioxide (LiNbO$_3$) substrate to constitute a surface wave element. A groove having a length of 7 mm and a width of 0.5 mm was formed in a surface opposite to the surface on which the transducer was formed and in a direction parallel to that in which a surface wave is propagated. Various samples were prepared by varying the depth of the groove within a range of 0–84 mm and the suppression of spurious signals was examined. In this case, a 30 MHz carrier frequency was used. The wavelength $\lambda_{sh}$ of an envelope as defined by spurious signals i.e., the wavelength of a bulk mode was 150 $\mu$m. FIG. 12 shows a relation between the depth of the groove and the suppression degree of spurious signals. In FIG. 12 use is made as a reference the suppression degree of spurious signals (spurious surface waves) when the depth of the groove is zero. As will be appreciated from FIG. 12 the spurious signals are effectively suppressed if a groove elongated in an elastic surface propagating direction 5 is provided in a surface opposite to the surface on which the interdigital transducers are formed. If the depth of the groove is so selected as to be more than 0.01 $\lambda_{sh}$, it is possible to suppress the spurious signals in a practical range. FIG. 12 shows a vibration characteristic. The maximum suppression value of spurious signals is presented at $\frac{1}{2}\lambda_{sh} \sin\theta$ (about 37 $\mu$m) and $\lambda_{sh} \sin\beta$(about 75 $\mu$m). With this maximum value, a 90% attenuation is effected at a suppression level of 10 dB with the resultant prominent advantage.

Such a groove as to meet these requirements has only to be provided in a surface opposite to the surface on which the interdigital transducer is formed.

Let us now explain modified embodiments according to this invention.

Figure 13:
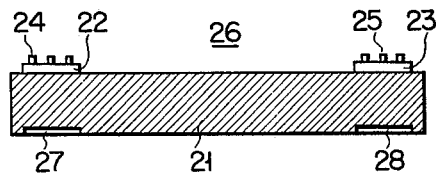
FIGS. 13 to 16 are side views each showing a modification of elastic surface wave device shown in FIG. 2.

In the configuration of FIG. 13 use is made, as a surface wave propagation medium, a non-piezoelectric material such as glass. Piezoelectric material films 22 and 23, for example, lithium niobium trioxide (LiNbO$_3$) films are formed by vapor deposition on those surfaces of the non-piezoelectric medium on which respective electric signal-surface wave transducers are to be formed. Then, interdigital electric signal-surface wave transducers 24 and 25 are formed on the piezoelectric films, respectively to constitute a surface wave element 26. Grooves 27, 28 elongated in a surface wave propagation direction are provided on a surface opposite to the surface on which the elastic surface wave is propagated.

Figure 14:
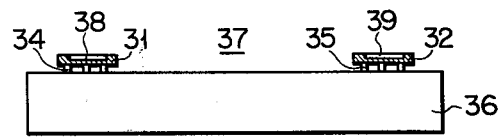

FIG. 14 shows another embodiment. In this embodiment, for example, LiNbO$_3$ plates 31 and 32 are prepared. An Au film is vapor deposited on one surface of the LiNbO$_3$ plates 31 and 32 to form interdigital transducers 34 and 35. The interdigital transducers 34 and 35 are located in a spaced-apart relation on each end portion of a surface wave transmission medium 36 made of a non-piezoelectric material such as glass, thereby forming a surface wave element 37.

Figure 15:
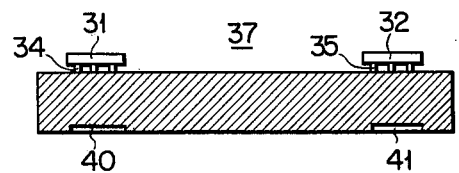
Figure 16:
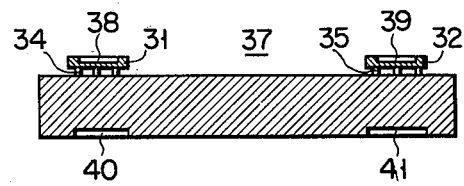
Figure 11:
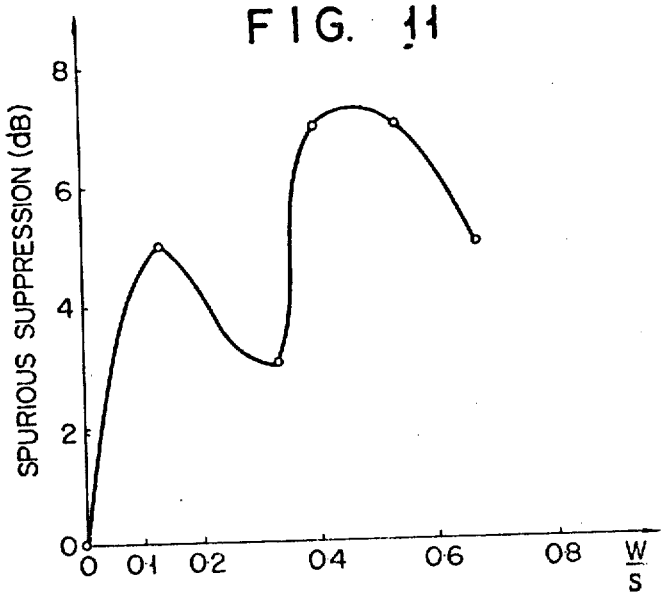
Figure 12:
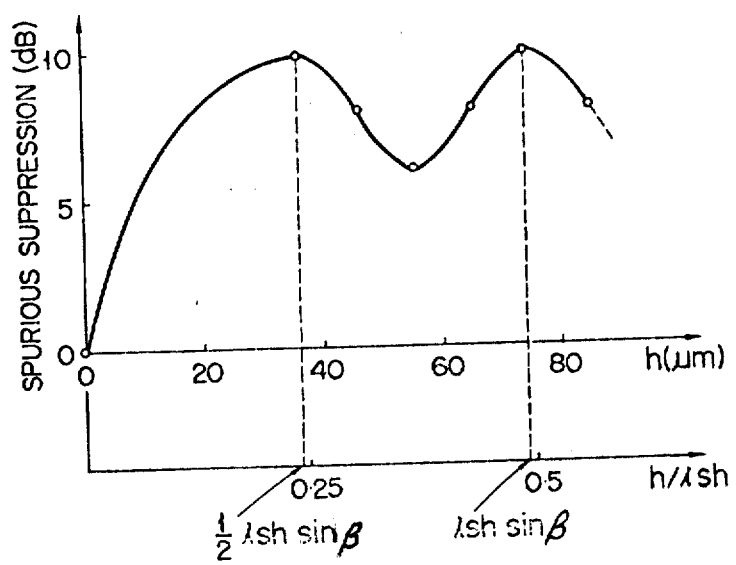

A groove −38, 39-elongated in a surface wave propagation direction 5 may be provided in the top surface of the LiNbO$_3$ plates 31, 32 as shown in FIG. 14. It is only sufficient that the groove is provided on either one of the LiNbO$_3$ plates 31 and 32. As shown in FIG. 15, a groove −40, 41-may be provided in a surface opposite to the surface on which the interdigital transducers are provided. It is only sufficient that the groove is provided in a surface opposite to the surface on which the interdigital transducer 34 or 35 is provided. Alternatively, a groove −38, 39, 40, 41-may be provided, as shown in FIG. 16, in the surface of the LiNbO$_3$ plates 31 and 32 as well as in the surface opposite to the surface on which the transducers are provided.

Though with the above-mentioned embodiments the LiNbO$_3$ is used as piezoelectric material, any piezoelectric material may be used. For example, crystal, ceramic etc. may be employed. The same result is obtained if interdigital transducers are formed by a Cr-Au vapor deposition on one surface of, for example, a crystal or ceramic substrate and at least one groove elongated in the elastic surface wave propagation direction is provided on a surface opposite to the surface on which the interdigital transducers are provided.

What we claim is:

1. An elastic surface wave device comprising a piezoelectric body and input and output conductors formed on the piezoelectric body and consisting of a pair of multi-fingered electrodes insulated from each other, arranged close to each other in an interdigital fashion and adapted to effect conversion between electric signal and a surface wave, said piezoelectric body having at least one groove formed in a surface opposite to the surface on which the conductor is formed, said groove being elongated in a direction in which a surface wave is propagated and at least a part of said groove being located in a portion of said body corresponding to the input conduction so as to interact with a surface wave and suppress spurious responses.

2. An elastic surface wave device according to claim 1 in which said input and output conductors are located in a spaced-apart relation on one surface of said piezoelectric body and said groove is formed in a surface opposite to the surface on which either one of the input and output conductors is formed.

3. An elastic surface wave device according to claim 1 in which said input and output conductors are provided through a piezoelectric film on one surface of a surface wave propagation medium, and a groove elongated in a surface wave propagation direction is formed in a surface opposite to the surface on which the conductor is provided.

4. An elastic surface wave device according to claim 1 in which piezoelectric bodies are provided through the conductor on one surface of a surface wave propagation medium and a groove elongated in a surface wave propagation direction is formed on the surface of at least one of the piezoelectric body and surface wave propagation medium which is not contacted with the conductor.

5. An elastic surface wave device according to claim 1 in which an angle at which the groove is made to the surface wave propagation direction is less than 45°.

6. An elastic surface wave device according to claim 1 in which the groove is formed in a direction parallel to the surface wave propagation direction.

7. An elastic surface wave device according to claim 1 in which the depth of the groove is more than 0.01 $\lambda sh$ in which $\lambda sh$ denotes the wavelength of spurious signals (bulk mode).

8. An elastic surface wave device according to claim 1 in which the depth of the groove is so formed as to satisfy an equation $$\lambda sh \cdot h \frac{2m-1}{l}$$

in which h denotes the depth of the groove,
l denotes the length of the groove, and
m denotes the width of the substrate.

9. An elastic surface wave device according to claim 1 in which the width of the groove is equal to more than 5% of an overlapped length of the finger of the interdigital conductor.

10. An elastic surface wave device according to claim 1 in which the width of the groove is half the overlapped length of the finger of the interdigital conductor.

* * * * *

UNITED STATES PATENT OFFICE
CERTIFICATE OF CORRECTION

Patent No. 3,980,904      Dated September 14, 1976

Inventor(s) Toshihiro Onodera et al.

It is certified that error appears in the above-identified patent and that said Letters Patent are hereby corrected as shown below:

The priority data listed on the face of the Grant should read as follows:

--Japanese applications Nos. 119997/73 - filed October 26, 1973; 78020/74--filed July 8, 1974; 78021/74- filed July 8, 1974; and 79935/74 - filed July 12, 1974.--

Signed and Sealed this

Twenty-third Day of November 1976

[SEAL]

*Attest:*

RUTH C. MASON
*Attesting Officer*

C. MARSHALL DANN
*Commissioner of Patents and Trademarks*

UNITED STATES PATENT OFFICE
CERTIFICATE OF CORRECTION

Patent No. 3,980,904          Dated September 14, 1976

Inventor(s) Toshihiro Onodera et al.

It is certified that error appears in the above-identified patent and that said Letters Patent are hereby corrected as shown below:

Column 4, line 1, "84 mm" should read -- 84 $\mu$m

Column 4, line 19, "sin$\theta$" should read -- sin$\beta$ --.

Figures 11 and 12 should appear as shown on the attached sheet.

Signed and Sealed this

Thirty-first Day of May 1977

[SEAL]

Attest:

RUTH C. MASON
*Attesting Officer*

C. MARSHALL DANN
*Commissioner of Patents and Trademarks*